(12) United States Patent
Yamakawa et al.

(10) Patent No.: US 8,878,320 B2
(45) Date of Patent: Nov. 4, 2014

(54) SEMICONDUCTOR MEMORY DEVICE

(75) Inventors: Koji Yamakawa, Tokyo (JP); Daisuke Ikeno, Yokohama (JP); Yasuki Sonoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 13/425,328

(22) Filed: Mar. 20, 2012

(65) Prior Publication Data

US 2012/0326251 A1 Dec. 27, 2012

(30) Foreign Application Priority Data

Jun. 24, 2011 (JP) .................................. 2011-141056

(51) Int. Cl.
*H01L 29/82* (2006.01)
*H01L 43/08* (2006.01)
*H01L 27/22* (2006.01)

(52) U.S. Cl.
CPC .............. *H01L 43/08* (2013.01); *H01L 27/222* (2013.01)
USPC .................... 257/421; 257/E29.323

(58) Field of Classification Search
USPC ......................................... 257/421–427, 295
See application file for complete search history.

(56) References Cited

U.S. PATENT DOCUMENTS

| | | | | |
|---|---|---|---|---|
| 5,936,293 A | * | 8/1999 | Parkin | 257/422 |
| 6,977,401 B2 | | 12/2005 | Hosotani | |
| 7,602,033 B2 | * | 10/2009 | Zhao et al. | 257/427 |
| 2003/0111626 A1 | * | 6/2003 | Hosotani | 251/200 |
| 2006/0114616 A1 | * | 6/2006 | Sbiaa et al. | 360/324.1 |
| 2007/0076469 A1 | * | 4/2007 | Ashida et al. | 365/158 |
| 2009/0080238 A1 | * | 3/2009 | Yoshikawa et al. | 365/158 |
| 2010/0109061 A1 | | 5/2010 | Kushida | |
| 2010/0254182 A1 | | 10/2010 | Kuroiwa et al. | |

FOREIGN PATENT DOCUMENTS

| | | |
|---|---|---|
| JP | 2003-249630 | 9/2003 |
| JP | 2010-16148 | 1/2010 |
| JP | 2010-67643 | 3/2010 |
| JP | 2010-114143 | 5/2010 |
| JP | 2010-245106 | 10/2010 |

OTHER PUBLICATIONS

Toshiba, Background Art Information, Aug. 3-Nov. 24, 2011.

* cited by examiner

*Primary Examiner* — David Vu
*Assistant Examiner* — Jonathan Han
(74) *Attorney, Agent, or Firm* — Knobbe, Martens, Olson & Bear, LLP (57) ABSTRACT

According to one embodiment, a semiconductor memory device includes plural magneto-resistance elements being two-dimensionally arrayed on a semiconductor substrate. In the semiconductor memory device, each of the magneto-resistance elements includes: a first magnetic layer formed on the semiconductor substrate; a non-magnetic layer formed on the first magnetic layer; and a second magnetic layer formed on the non-magnetic layer, and an insulating film buried between the magneto-resistance elements adjacent to each other, a powder made of a metallic material or a magnetic material being dispersed in the insulating film.

20 Claims, 7 Drawing Sheets

SEMICONDUCTOR MEMORY DEVICE

CROSS-REFERENCE TO RELATED APPLICATION

This application is based upon and claims the benefit of priority from prior Japanese Patent Application No. 2011-141056, filed on Jun. 24, 2011, the entire contents of which are incorporated herein by reference.

FIELD

Embodiments of the present invention relate to a semiconductor memory device.

BACKGROUND

Recently, a Magnetic Random Access Memory (hereinafter abbreviated to MRAM) in which a Tunneling Magneto Resistive (hereinafter abbreviated to TMR) effect is utilized is developed as a nonvolatile semiconductor memory (semiconductor memory device). The MRAM is a nonvolatile semiconductor memory having features such as high-speed write/read, a low-power-consumption operation, and a high density memory storage, and expected to be applied as a working memory. The MRAM includes a Magnetic Tunnel Junction (hereinafter abbreviated to MTJ) element, and the MTJ element is a magneto-resistance element having a large magneto-resistance change value.

Particularly, the MTJ element basically adopts a three-layer stacked structure including a storage layer made of a magnetic film in which data is stored by changing a magnetization direction, a reference layer made of magnetic films that is used to unidirectionally fixed magnetization, and a tunnel junction layer (non-magnetic layer) that is made of an insulating film and formed between the storage layer and the reference layer. When a current is passed through the MTJ element including storage layer/tunnel junction layer/reference layer, a resistance value of the MTJ element is changed according to the magnetization direction of the storage layer relative to the magnetization direction of the reference layer. Specifically, the resistance value takes a minimum value when the magnetization directions of the storage layer and the reference layer are parallel to each other, and the resistance value takes a maximum value when the magnetization directions are antiparallel. The phenomenon is called a Tunneling Magneto-Resistance effect (hereinafter referred to as a TMR effect), and the TMR effect is utilized in a memory operation such that the state in which the magnetization directions of the storage layer and the reference layer are parallel is set to data "0" while the state in which the magnetization directions of the storage layer and the reference layer are antiparallel is set to "1".

Conventionally, in order to operate the MRAM, a current is passed through a wiring disposed near the storage layer of the MTJ element, and the magnetization direction of the storage layer is inverted by utilizing a magnetic field generated around the storage layer (magnetic field write method). However, in the magnetic field write method, although the generated magnetic field can be increased with increasing current, the current permitted in the wiring is restricted due to the maximum current density based on reliability of the miniaturized MRAM, whereby the large-capacity memory of the MRAM is hardly fabricated. The write current necessary to write the data can be decreased by bringing the wiring closer to the storage layer or by devising a material used for the wiring. However, a coercive field of the storage layer is increased in principle by the miniaturization of the MJT element. That is, in the magnetic field write method, it is difficult to achieve a balance between the miniaturization of the MTJ element and the decrease of the write current.

Therefore, recently a spin injection write method in which the magnetization is inverted by utilizing a spin-polarization current is being investigated. In the spin injection write method, the spin-polarization current is passed through the MTJ element to invert the magnetization direction of the storage layer. In the spin injection write method, the number of spin-polarized electrons necessary for the magnetization inversion is decreased with reducing volume of the storage layer in which the magnetization direction is inverted, which allows the write current to be decreased.

The MTJ element can roughly be classified into two. One is an in-plane magnetization type MTJ element in which an in-plane magnetic film having an easy axis of magnetization parallel to a film surface is used as the magnetic film. The other is a perpendicular magnetization type MTJ element in which a perpendicular magnetic film having the easy axis of magnetization perpendicular to the film surface is used as the magnetic film.

DETAILED DESCRIPTION

In one embodiment, a semiconductor memory device includes plural magneto-resistance elements being two-dimensionally arrayed on a semiconductor substrate, and each of the magneto-resistance elements includes: a first magnetic layer formed on the semiconductor substrate; a non-magnetic layer formed on the first magnetic layer; and a second magnetic layer formed on the non-magnetic layer, and an insulating film buried between the magneto-resistance elements adjacent to each other, a powder made of a metallic material or a magnetic material being dispersed in the insulating film.

Hereinafter, embodiments will be described with reference to the drawings. However, the invention is not limited to the embodiments. In all the drawings, a common portion is denoted by a common numeral, and the overlapping description is omitted. The drawings are schematic drawings for the purpose of easy understanding of the invention, and sometimes a shape, a size, and a ratio of the device in the drawings differ from those of the actual device. However, design changes of the shape, the size, and the ratio of the device can properly be made by referring to the following description and the well-known art.

First Embodiment

Figure 1:
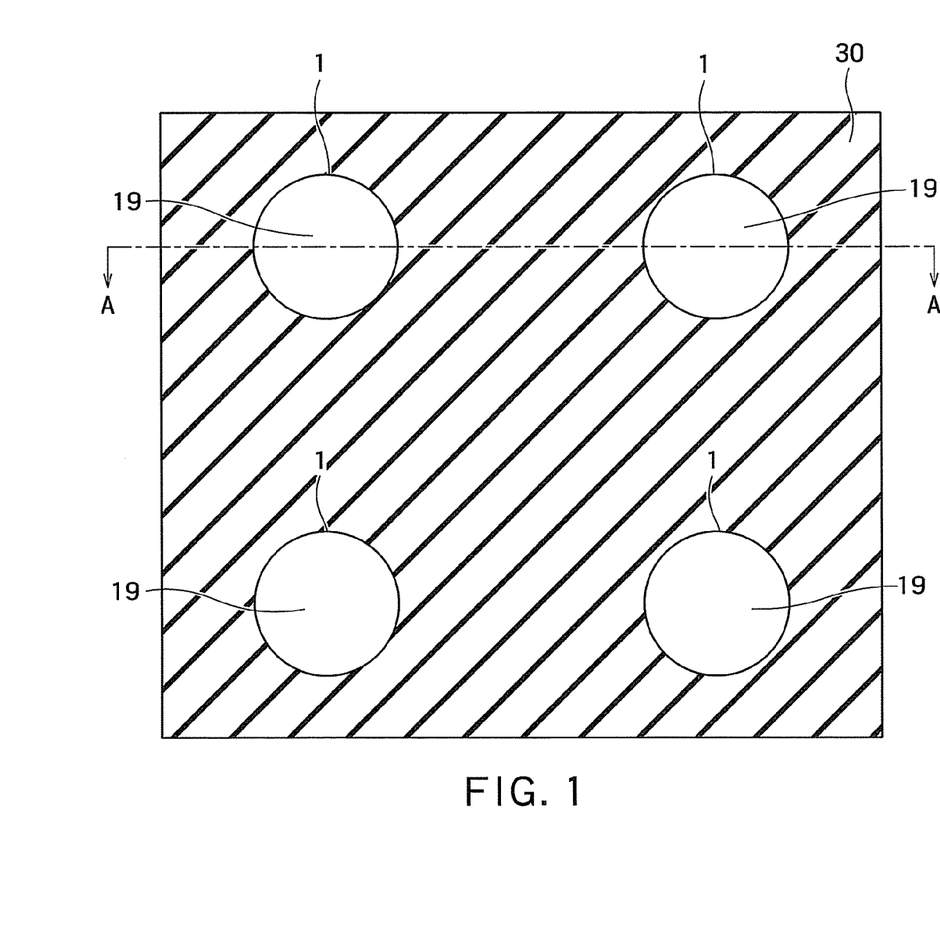
FIG. 1 is a plan view of a semiconductor memory device according to a first embodiment.
Figure 2:
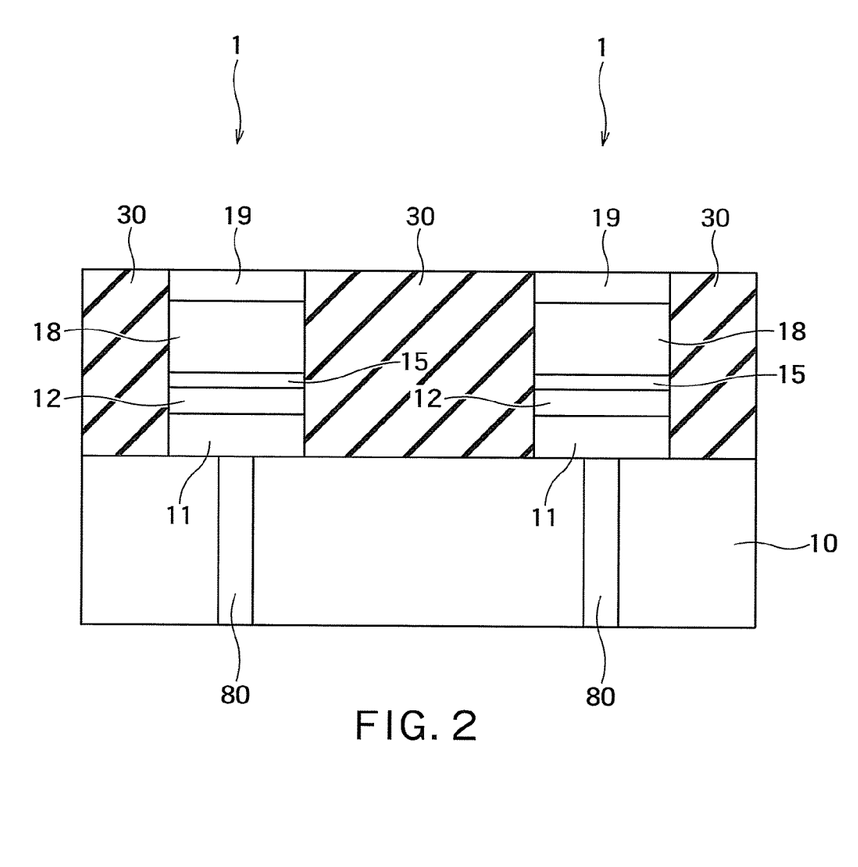
FIG. 2 is a sectional view (part 1) of the semiconductor memory device of the first embodiment.

A first embodiment will be described below with reference to FIGS. 1 and 2. FIG. 1 is a plan view of a semiconductor memory device of the first embodiment, and FIG. 2 is a sectional view taken on a line A-A' of FIG. 1. In the first to third embodiments, a spin-injection write type MRAM (semiconductor memory device) including an MTJ element (magneto-resistance element) 1 in which a perpendicular magnetic film is used will be described by way of example. However, the invention is not limited to the first to third embodiments, but the invention may be applied to an in-plane magnetization type MTJ element in which an in-plane magnetic film is used.

As illustrated in FIG. 1, the MTJ elements 1 are two-dimensionally arrayed on a semiconductor substrate 10 including contact plugs 80. As illustrated in FIG. 2, the MTJ element 1 of the first embodiment has a stacked structure including a lower metallic layer 11 that is formed on the semiconductor substrate 10, a storage layer (first magnetic layer) 12 that is formed on the lower metallic layer 11 and made of the perpendicular magnetic film, a tunnel junction layer (non-magnetic layer) 15 that is formed on the storage layer 12, a reference layer (second magnetic layer) 18 that is formed on the tunnel junction layer 15 and made of the perpendicular magnetic film, and a cap layer 19 that is formed on the reference layer 18. An insulating film 30 in which powders are dispersed is buried between the MTJ elements 1 adjacent to each other. An interlayer insulator (not illustrated) is provided on the MTJ element 1 and the insulating film 30, a contact plug (not illustrated) is provided in the interlayer insulator, and the contact plug electrically connects an upper electrode layer (not illustrated) of the MTJ element 1 and a wiring on the interlayer insulator. The MTJ elements 1 adjacent to each other can electrically be connected by the wiring.

More particularly, the insulating film 30 acts as a magnetic shield, which blocks magnetic interference action between the MTJ elements 1, while electrically separating the MTJ elements 1 from each other. That is, the insulating film 30 can suppress a magnetic crosstalk generated between the MTJ elements 1, and block an influence of a noise generated by each MTJ element 1.

The powders dispersed in the insulating film 30 are made of a metal or a magnetic material containing at least one of Fe, Co and Ni. For example, each of the powders may contain a metal having one of Fe, Co and Ni, an alloy thereof such as CoFeB and NiFe, an oxide film thereof, and a nitride film thereof. Desirably each of the powders is formed into a spherical shape because the powders are dispersed in the insulating film 30. Alternatively, each of the powders may be a slightly angular particle. When the particle diameter of each of the powders is excessively large, possibly a short-circuit is generated in the MTJ element 1 and the powders hardly invade between the MTJ elements 1. Therefore, the particle diameter of each powders should be preferably shorter than the distance between the MTJ elements 1 to be adjacent to each other. For example, the particle diameter ranges from 5 nm to tens of nanometers. In order to maintain an insulating property of the insulating film 30, desirably the powders are included in the insulating film 30 so as to occupy 10% to 40% of a volume of the insulating film 30, and desirably the powders are evenly dispersed in the insulating film 30.

Figure 3:
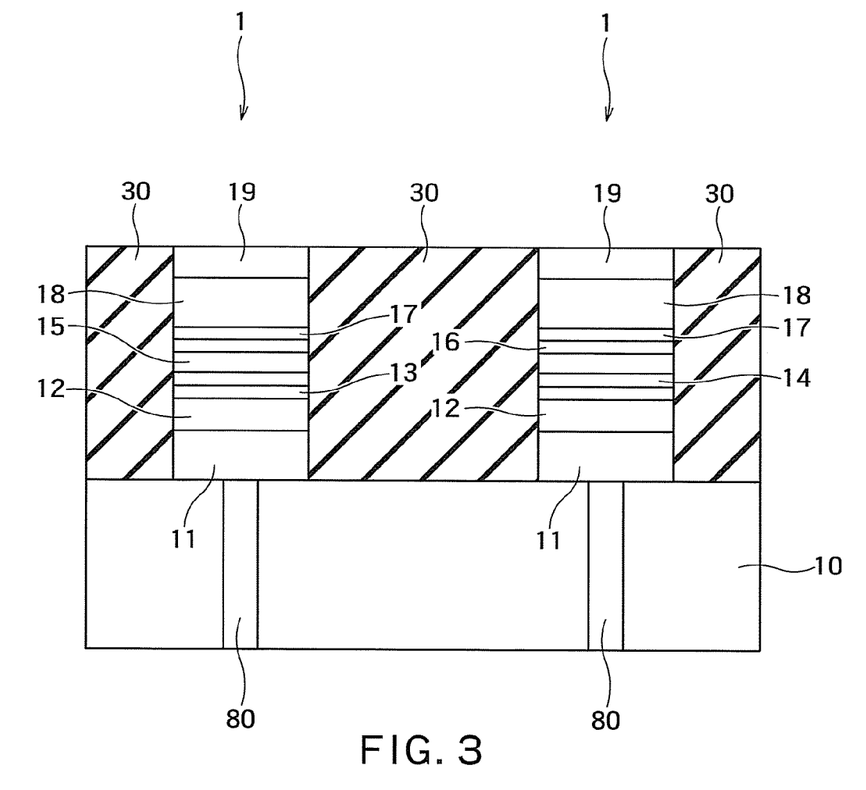
FIG. 3 is a sectional view (part 2) of the semiconductor memory device of the first embodiment.

As illustrated in FIG. 3, which is of a modification of the first embodiment and corresponds to the section A-A' of FIG. 1, interface magnetic layers 14 and 16 may be formed between the storage layer 12 and the tunnel junction layer 15 and between the tunnel junction layer 15 and the reference layer 18, respectively. Additionally, diffusion preventing films 13 and 17 may be formed between the storage layer 12 and the interface magnetic layer 14 and between the interface magnetic layer 16 and the reference layer 18, respectively.

Because the interface magnetic layers 14 and 16 have high polarizability, the MTJ element 1 includes the interface magnetic layers 14 and 16 to acquire the larger TMR. In heat treatment processes such as a crystallization heat treatment of the tunnel junction layer 15, the formation of the insulating film 30, Reactive Ion Etching (RIE), and the formation of the wiring in a semiconductor memory device producing process, diffusion of a metallic element constituting each layer is prevented by providing the diffusion preventing films 13 and 17 in the MTJ element 1, thereby preventing degradation of magnetization characteristics of the storage layer 12 and the reference layer 18 and electric characteristics (such as TMR effect) of the MTJ element 1. Additionally, crystallinity necessary for the interface magnetic layers 14 and 16 to maintain the high TMR effect can be retained by providing the diffusion preventing films 13 and 17, and crystallinity necessary for the sufficient perpendicular magnetic anisotropy can also be retained in the storage layer 12 and the reference layer 18. The MTJ element 1 is not limited to the stacked structures of FIGS. 2 and 3, but various modes can be adopted.

Particularly, for example, the lower metallic layer 11 is made of Pt, Ir, Ru, Cu and the like. The lower metallic layer 11 can act as an orientation control film in forming the storage layer 12 formed on the lower metallic layer 11.

The storage layer 12 can be made of an element such as Fe, Co, and Ni, an element such as Cr, Pt, Pd, Ir, Rh, Ru, Os, Re, and Au, and an alloy thereof. Alternatively, an artificial-lattice perpendicular magnetic film in which the alloys are stacked may be used as the storage layer 12. Specifically, the storage layer 12 is stacked by a combination of a magnetic material layer and a non-magnetic material layer such as Co/Pt, Co/Pd, and Co/Ru. The magnetization characteristic can be adjusted by a composition of the magnetic material layer and a ratio of the magnetic layer and the non-magnetic layer. Alternatively, the storage layer 12 may be formed by a combination a Ru film and an antiferromagnetic material layer such as PtMn and IrMn.

The tunnel junction layer 15 can be made of MgO, CaO, SrO, TiO, VO, NbO, and $Al_2O_3$. Desirably the tunnel junction layer 15 is made of an oxide having an NaCl structure. The tunnel junction layer 15 made of a (100) preferentially-oriented insulating film can be obtained when crystal growth of the oxide is performed on a structure of an alloy mainly containing Fe, Co, and Ni, such as an amorphous CoFeB alloy. For example, the tunnel junction layer 15 has a thickness of about 10 Å and an area resistance value of 100 $\Omega\mu^2$.

A layer of an L10-system ordered alloy layer FePd and FePt is used as the reference layer 18. Saturation magnetization and anisotropic magnetic energy of the ordered alloy layer can be adjusted by adding an element such as Cu to the ordered alloy layer.

The cap layer 19 is made of Ru, Ta and the like.

As to the interface magnetic layers 14 and 16, it is necessary to keep good coherency of an interface between a (100) plane of the tunnel junction layer 15 made of the oxide having the NaCl structure and the storage layer 12 and the reference layer 18. Therefore, desirably a material having small lattice incoherency to the (100) plane of the tunnel junction layer 15 is selected as the material for the interface magnetic layers 14 and 16. For example, CoFeB is used as the material for the interface magnetic layers 14 and 16. As described above, because the interface magnetic layers 14 and 16 have the high polarizability, and the MTJ element 1 includes the interface magnetic layers 14 and 16 to acquire the large TMR.

The diffusion preventing films 13 and 17 can be made of a high-melting-point metal such as Ti, Ta, W, Mo, Nb, Zr, and Hf, a nitride or a carbide thereof. As described above, in the heat treatment processes of the semiconductor memory device producing process, the diffusion preventing films 13 and 17 prevent the diffusion of the metallic element constituting each layer, thereby preventing the degradation of magnetization characteristics of the storage layer 12 and the reference layer 18 and the electric characteristics (such as TMR) of the MTJ element 1. Additionally, the crystallinity necessary for the interface magnetic layers 14 and 16 to maintain the high TMR effect can be retained by the diffusion preventing films 13 and 17, and the crystallinity necessary for the sufficient perpendicular magnetic anisotropy can also be retained in the storage layer 12 and the reference layer 18.

The above semiconductor memory device is produced as follows.

After each layer constituting the stacked structure of the MTJ element 1 is formed by a well-known method, a hard mask made of a material such as $SiO_2$ and SiN is formed on the stacked structure, the hard mask is patterned using a photoresist, and each layer is processed as the stacked structure of the MTJ element 1 using the patterned hard mask. For example, physical processing by Ion Beam Etching (IBE) or RIE is used in the processing. Because a noble metal is used in the thin tunnel junction layer 15 made of MgO and the like, a residue of the noble metal adheres to the sidewall of the MTJ element 1 during the processing, which sometimes causes a leakage in the MTJ element 1. Therefore, a tapered angle is optimized in the tunnel junction layer 15. Desirably a processing condition, a processing gas, and an aftertreatment are optimized such that the residue does not remain in processing the sidewall of the MTJ element 1.

After the MTJ element 1 is formed, the insulating film 30 is formed so as to fill a gap between the MTJ elements 1 adjacent to each other. At this point, for example, an application, Chemical Vapor deposition (CVD), sputtering, and co-sputtering can be adopted.

Particularly, in the case of the application, while the powders are placed in Silicon On Glass (SOG), the powders are applied so as to fill a gap between the MTJ elements 1, whereby the insulating film 30 in which the powders are dispersed can be formed. At this point, desirably the powders are evenly disposed in the insulating film 30 such that the short-circuit between the MTJ elements 1 can be prevented to evenly bury the insulating film 30 between the MTJ elements 1. However, the invention is not limited to the first embodiment. For example, the powders may be eccentrically located in a central portion between the MTJ elements 1 in the plan view illustrating the semiconductor memory device of the first embodiment, or the powders may be eccentrically located in an upper portion between the MTJ elements 1 in the sectional view illustrating the semiconductor memory device. In such cases, a magnetic shield effect can be enhanced while an insulating property between the MTJ elements 1 is secured.

In the case of the CVD, the sputtering, and the co-sputtering, the insulating film 30 in which the powders are dispersed can be formed by simultaneously or alternately depositing the material for the insulating film 30 and the material for the powders. In such cases, insulating materials such as SiOx, SiN, AlOx, and MgO or a mixture thereof can be used as the material for the insulating film 30. At this point, as described above, desirably the powders are included in the insulating film 30 so as to occupy 10% to 40% of a volume of the insulating film 30. In the case that the insulating film 30 in which the powders are eccentrically located is formed by simultaneously depositing the material for the insulating film 30 and the material for the powders, the materials are not always supplied at the same proportion, but the materials are supplied while the proportion is changed, which allows the desired insulating film 30 to be obtained. In the case that the material for the insulating film 30 and the material for the powders are alternately deposited, the desired insulating film 30 can be obtained by changing stacked film thicknesses of the materials.

According to the first embodiment, the semiconductor memory device includes the insulating film 30 as the magnetic shield that blocks the magnetic interference action between the MTJ elements 1. Therefore, the problem that the magnetic field leaking out from the magnetic material film constituting each MTJ element 1 influences magnetization stability, a switching characteristic, and the like of the adjacent MD element 1 to disturb a normal operation of the MTJ element 1 can be avoided to perform the stable operation of the MTJ element 1. The magnetic shield is formed by dispersing the powders made of the metal or magnetic material in the insulating film 30 buried in the MTJ element 1, so that the magnetic shield can easily be produced without largely changing the production process. Additionally, according to the first embodiment, in order to maintain the insulating property of the insulating film 30, the powders having the particle diameter that is shorter than the distance between the MTJ elements 1 are included in the insulating film 30 so as to occupy 10% to 40% of the volume of the insulating film 30, so that the insulating film 30 can electrically separate the MTJ elements 1 from each other.

Second Embodiment

Figure 5:
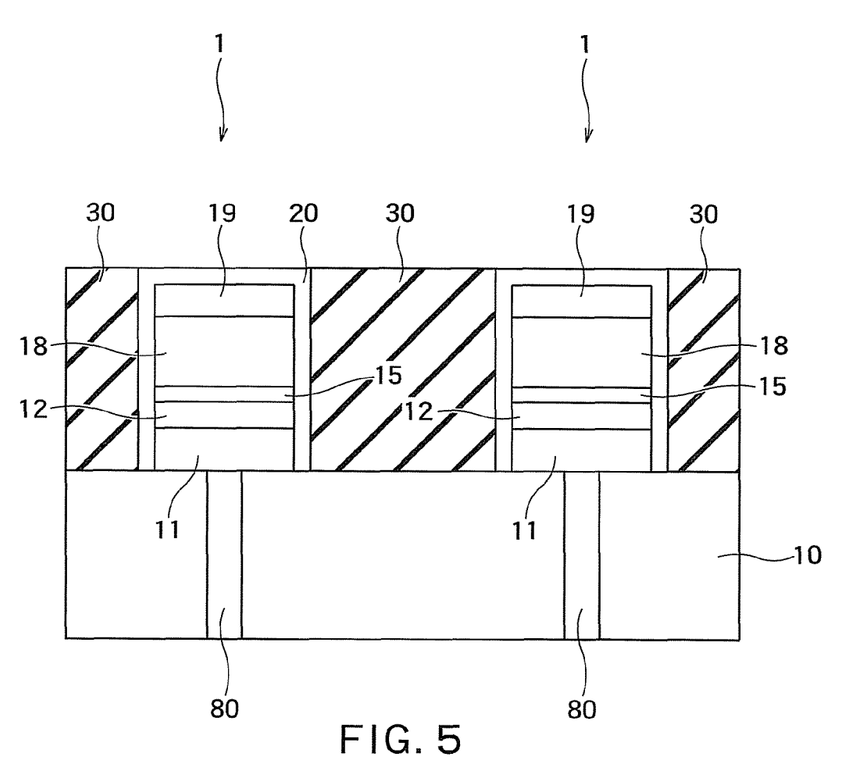
FIG. 5 is a sectional view of the semiconductor memory device of the second embodiment.

A second embodiment differs from the first embodiment in that the MTJ element further includes a protective film covering a sidewall thereof. The protective film can further securely prevent a short-circuit between the MTJ elements 1.

Figure 4:
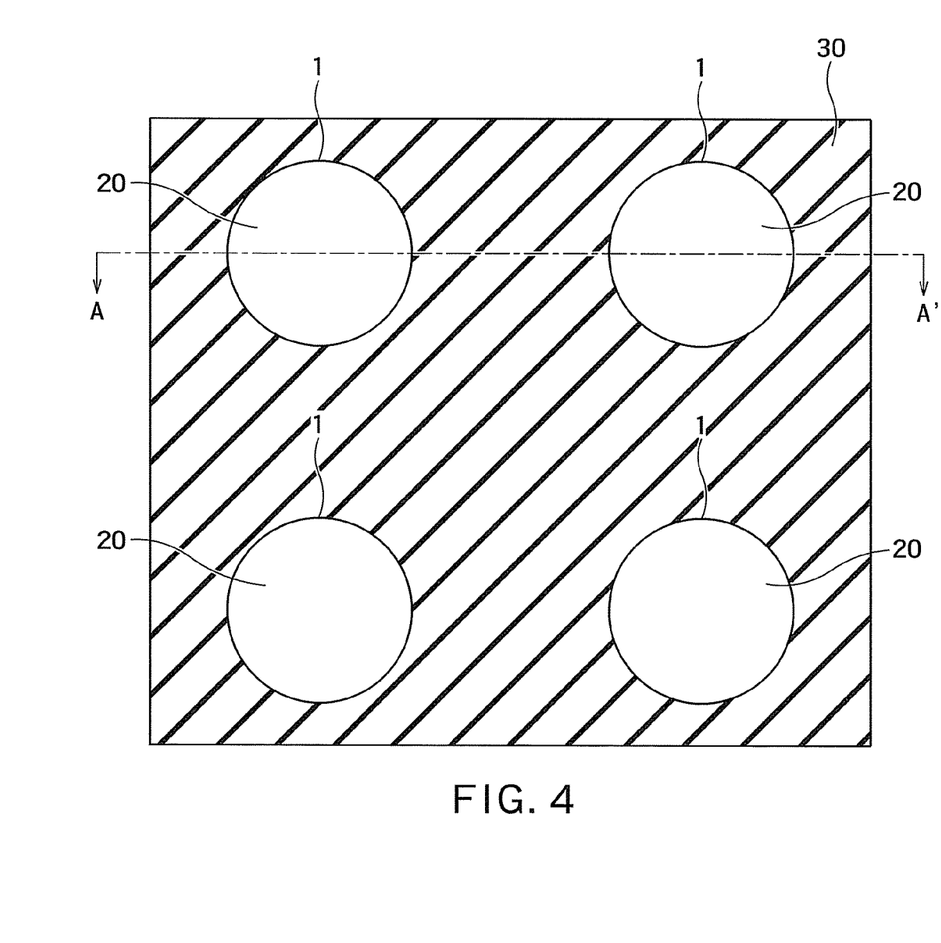
FIG. 4 is a plan view of a semiconductor memory device according to a second embodiment.

The second embodiment will be described below with reference to FIGS. 4 and 5. FIG. 4 is a plan view of a semiconductor memory device of the second embodiment, and FIG. 5 is a sectional view taken on a line A-A' of FIG. 4. The description of the portion common to the first embodiment is omitted.

As illustrated in FIG. 4, the MTJ elements 1 are two-dimensionally arrayed on the semiconductor substrate 10. As illustrated in FIG. 5, the MTJ element 1 includes a protective film 20 that covers a side surface and an upper surface thereof. An insulating film 30 in which metals or magnetic materials are dispersed is buried between the MTJ elements 1 adjacent to each other.

Desirably the protective film 20 is made of an insulating material in order to maintain an insulating property between an upper electrode layer (not illustrated) and the lower electrode layer 11. Examples of the insulating material include $Al_2O_3$, $SiO_2$, TiOx, and SiN. The protective film 20 is formed so as to cover the sidewall and the upper surface of the MTJ element 1. At this point, desirably Atomic Layer Deposition (ALD), CVD, and Physical Vapor Deposition (PVD), and the like are adopted such that each layer of the MTJ element 1 is not damaged.

According to the second embodiment, similarly to the first embodiment, the semiconductor memory device includes the insulating film 30 that blocks the magnetic interference action between the MTJ elements 1 as the magnetic shield while electrically separating the MTJ elements 1 from each other. Therefore, the problem that the magnetic field leaking out from the magnetic material film constituting each MTJ element 1 influences the magnetization stability and the like of the adjacent MTJ element 1 to disturb the normal operation of the MTJ element 1 can be avoided to perform the stable operation of the MTJ element 1. The magnetic shield is formed by dispersing the powders made of the metal or magnetic material in the insulating film 30 buried in the MTJ element 1, so that the magnetic shield can easily be produced without largely changing the production process. Additionally, according to the second embodiment, the short-circuit between the MTJ elements 1 can further securely be prevented by covering the MTJ elements 1 with the protective film.

Third Embodiment

Figure 7:
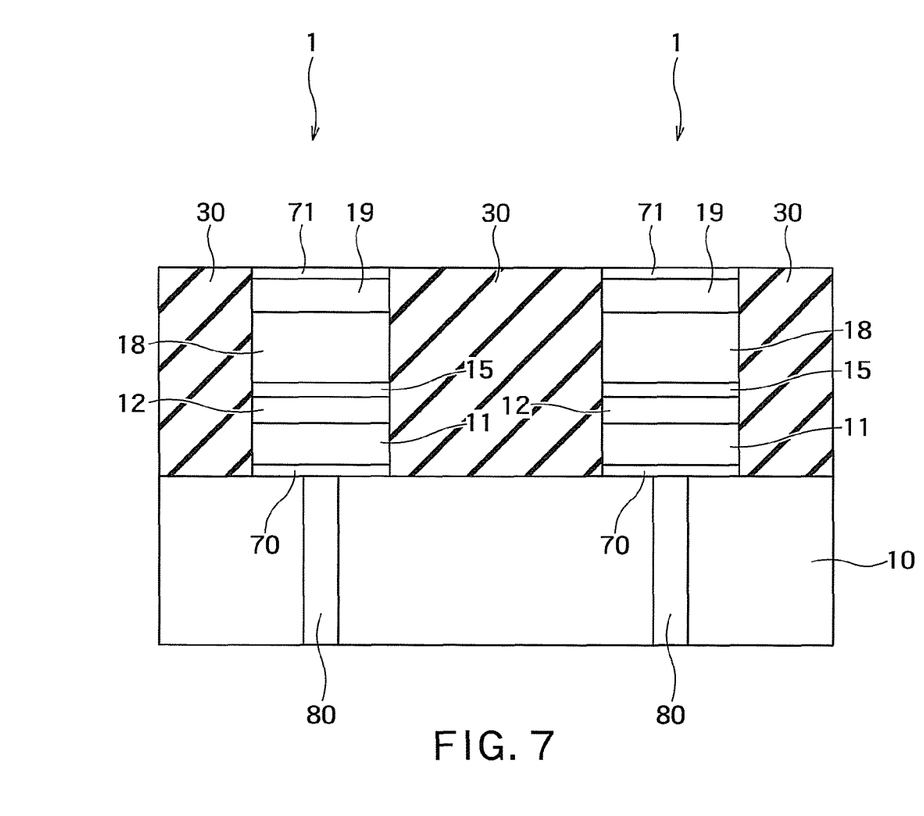
FIG. 7 is a sectional view of the semiconductor memory device of the third embodiment.

A third embodiment differs from the first embodiment in that the MTJ element 1 includes a lower magnetic shield film 70 formed in a lower portion of the MTJ element 1 and an upper magnetic shield film 71 formed in an upper portion of the MTJ element 1. The lower magnetic shield film 70 and the upper magnetic shield film 71 can suppress an influence of the magnetic field that is mainly generated from an external environment.

Figure 6:
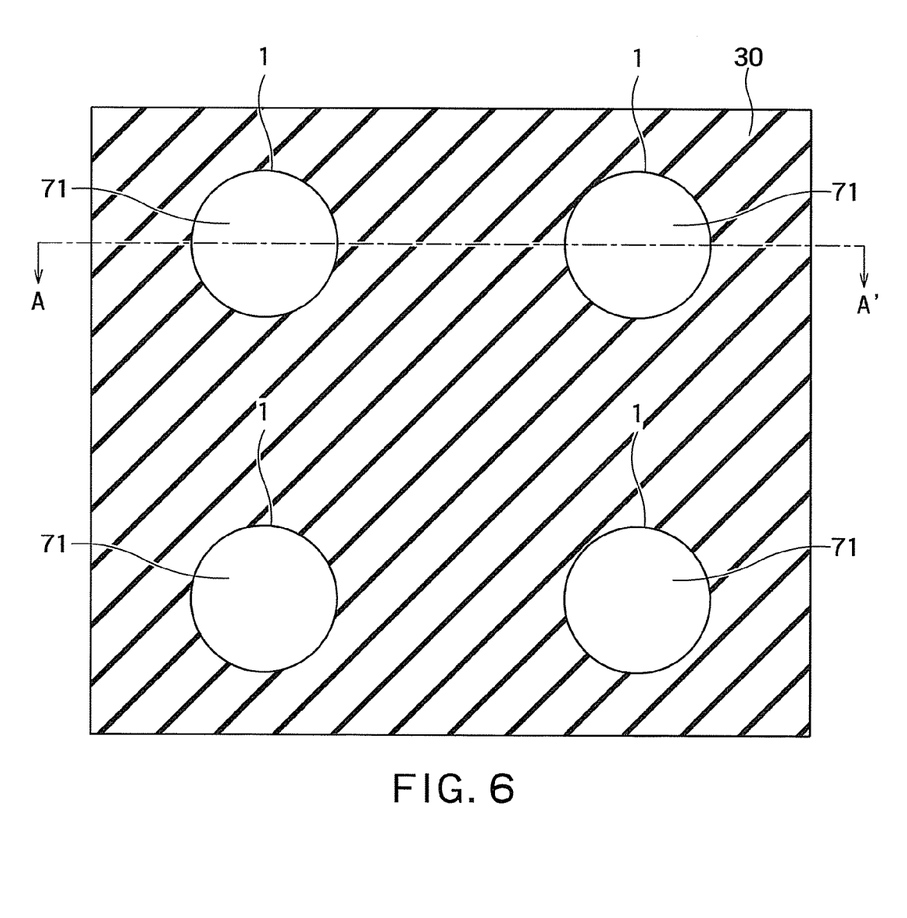
FIG. 6 is a plan view of a semiconductor memory device according to a third embodiment.

A third embodiment will be described below with reference to FIGS. 6 and 7. FIG. 6 is a plan view of a semiconductor memory device of the third embodiment, and FIG. 7 is a sectional view taken on a line A-A' of FIG. 6. The description of the portion common to the first embodiment is omitted.

As illustrated in FIG. 6, the MTJ elements 1 are two-dimensionally arrayed on the semiconductor substrate 10. As illustrated in FIG. 7, the lower magnetic shield film 70 is formed in the lower portion of the MTJ element 1, and the upper magnetic shield film 71 is formed in the upper portion of the MTJ element 1. The insulating film 30 in which the powders made of the metal or magnetic material are dispersed is buried between the MTJ elements 1 adjacent to each other.

Desirably the lower magnetic shield film 70 and the upper magnetic shield film 71 are made of the metal or the magnetic material such as Co, Fe, CoFeB, Ni, and NiFe.

The lower magnetic shield film 70 and the upper magnetic shield film 71 are produced as follows.

The metal or magnetic material is deposited on the semiconductor substrate 10 to form the lower magnetic shield film 70. At this point, for example, the sputtering can be adopted. The lower metallic layer 11 is formed on the lower magnetic shield film 70. The lower magnetic shield film 70 may be formed so as to have an area larger than the cross section of the MTJ element 1. Alternatively, the lower magnetic shield film 70 is not formed so as to be in direct contact with the lower metallic layer 11, but the lower magnetic shield film 70 may be formed while electrically insulated from the lower metallic layer 11. In this case, patterning is performed once. The lower magnetic shield film 70 may be formed on the semiconductor substrate 10 so as to surround the portion in which the MTJ element 1 is formed, not in the lower portion of the MTJ element 1.

Similarly to the first embodiment, after each layer constituting the stacked structure of the MTJ element 1 is formed by a well-known method, the layer is processed as the stacked structure of the MTJ element 1. The upper magnetic shield film 71 is formed on the cap layer 19 by the same method as the lower magnetic shield film 70. Instead of being in contact with the cap layer 19, the upper magnetic shield film 71 may be formed while not electrically in contact with the cap layer. For example, the protective film 20 of the second embodiment is formed on the cap layer 19, and the upper magnetic shield film 71 may be formed on the protective film 20. At this point, the upper magnetic shield film 71 can directly be formed on the protective film 20 in a case that the protective film 20 has good coverage. In a case that the protective film 20 has poor coverage, an insulating film covering the protective film 20 is formed by the CVD and the like, and the upper magnetic shield film 71 can be formed on the insulating film.

According to the third embodiment, similarly to the first embodiment, the semiconductor memory device includes the insulating film 30 that blocks the magnetic interference action between the MTJ elements 1 as the magnetic shield while electrically separating the MTJ elements 1 from each other. Therefore, the problem that the magnetic field leaking out from the magnetic material film constituting each MTJ element 1 influences the magnetization stability and the like of the adjacent MTJ element 1 to disturb the normal operation of the MTJ element 1 can be avoided to perform the stable operation of the MTJ element 1. The magnetic shield is formed by dispersing the powders made of the metal or magnetic material in the insulating film 30 buried in the MTJ element 1, so that the magnetic shield can easily be produced without largely changing the production process. Additionally, according to the third embodiment, the lower magnetic shield film 70 and the upper magnetic shield film 71 can suppress the influence of the magnetic field that is mainly generated from the external environment.

In the first to third embodiments, the reference layer 18 is stacked above the storage layer 12 in the MTJ element 1. Alternatively, the storage layer 12 may be stacked above the reference layer 18. In the first to third embodiments, the silicon substrate may not be always used as the semiconductor substrate 10, but another substrate may be used. Alternatively, a semiconductor structure may be formed on various substrates.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   magneto-resistance elements two-dimensionally arrayed on a semiconductor substrate such that there is a space between the magneto-resistance elements adjacent to each other; and
   an insulating film filling the space between the magneto-resistance elements adjacent to each other and in direct contact with the magneto-resistance elements;
   wherein each of the magneto-resistance elements comprises:
   a first magnetic layer on the semiconductor substrate;
   a non-magnetic layer on the first magnetic layer; and
   a second magnetic layer on the non-magnetic layer, and
   wherein the insulating film comprises a magnetic material.

2. The semiconductor memory device according to claim 1, wherein the metallic material or the magnetic material contains at least one of Fe, Co and Ni.

3. The semiconductor memory device according to claim 1, wherein the insulating film is a nitride film or an oxide film, which contains at least one of Si, Al, and Mg.

4. The semiconductor memory device according to claim 1, wherein each of the magneto-resistance elements further comprises:
   a first interface magnetic layer formed between the first magnetic layer and the non-magnetic layer; and a second interface magnetic layer formed between the second magnetic layer and the non-magnetic layer.

5. The semiconductor memory device according to claim 4, wherein
each of the magneto-resistance elements further comprises:
a first diffusion preventing film formed between the first magnetic layer and the first interface magnetic layer; and
a second diffusion preventing film formed between the second interface magnetic layer and the second magnetic layer.

6. The semiconductor memory device according to claim 1, wherein the magnetic material is a powder.

7. The semiconductor memory device according to claim 6, wherein the powders are included in the insulating film so as to occupy about 10% to about 40% of a volume of the insulating film.

8. The semiconductor memory device according to claim 6, wherein a particle diameter of each of the powders is shorter than the distance between the magneto-resistance elements to be adjacent to each other.

9. The semiconductor memory device according to claim 6, wherein the powders are evenly dispersed in the insulating film.

10. The semiconductor memory device according to claim 1, further comprising:
a lower magnetic shield film formed in a lower portion of each of the magneto-resistance elements; and
an upper magnetic shield film formed in an upper portion of each of the magneto-resistance elements.

11. The semiconductor memory device according to claim 10, wherein the lower magnetic shield film and the upper magnetic shield film are made of the metallic material or the magnetic material, which contains one of Fe, Co, Ni, and an alloy thereof.

12. The semiconductor memory device according to claim 10, wherein the metallic material or the magnetic material contains at least one of Fe, Co and Ni.

13. The semiconductor memory device according to claim 10, wherein the magnetic material is powders occupying about 10% to about 40% of a volume of the insulating film.

14. The semiconductor memory device according to claim 10, wherein the magnetic material is a powder whose particle diameter is shorter than the distance between the magneto-resistance elements adjacent to each other.

15. The semiconductor memory device according to claim 10, wherein the magnetic material is powders evenly dispersed in the insulating film.

16. A semiconductor memory device comprising:
magneto-resistance elements two-dimensionally arrayed on a semiconductor substrate such that there is a space between the magneto-resistance elements adjacent to each other;
a protective film that covers a sidewall of the each of the magneto-resistance elements; and
an insulating film filling the space between the magneto-resistance elements adjacent to each other;
wherein each of the magneto-resistance elements comprises:
a first magnetic layer on the semiconductor substrate;
a non-magnetic layer on the first magnetic layer; and
a second magnetic layer formed on the non-magnetic layer; and
wherein the insulating film comprises a magnetic material in the form of powders included in the insulating film occupying about 10% to about 40% of a volume of the insulating film.

17. The semiconductor memory device according to claim 16, wherein the insulating film is a nitride film or an oxide film, which contains at least one of Si, Al, and Mg.

18. The semiconductor memory device according to claim 16, wherein the magnetic material contains at least one of Fe, Co and Ni.

19. The semiconductor memory device according to claim 16, wherein a particle diameter of each of the powders is shorter than the distance between the magneto-resistance elements adjacent to each other.

20. The semiconductor memory device according to claim 16, wherein the powders are evenly dispersed in the insulating film.

\* \* \* \* \*